US008837239B2

(12) United States Patent
Jung et al.

(10) Patent No.: US 8,837,239 B2
(45) Date of Patent: Sep. 16, 2014

(54) LATENCY CONTROL CIRCUIT AND SEMICONDUCTOR DEVICE INCLUDING THE CIRCUIT

(71) Applicants: SK Hynix Inc., Icheon-si (KR); University of Seoul Industry Cooperation Foundation, Seoul (KR)

(72) Inventors: Jong Gon Jung, Seoul (KR); Yong Sam Moon, Seoul (KR); Yong Ju Kim, Seoul (KR); Jong Ho Jung, Pocheon-si (KR)

(73) Assignees: SK Hynix Inc., Icheon (KR); University of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 13/797,574

(22) Filed: Mar. 12, 2013

(65) Prior Publication Data

US 2014/0010029 A1  Jan. 9, 2014

(30) Foreign Application Priority Data

Jul. 4, 2012  (KR) .......................... 10-2012-0072954

(51) Int. Cl.
*G11C 7/00* (2006.01)
*G11C 7/22* (2006.01)

(52) U.S. Cl.
CPC ........ *G11C 7/222* (2013.01); *G11C 2207/2272* (2013.01)

USPC ........................................ 365/194; 365/233.1

(58) Field of Classification Search
USPC .................... 365/194, 233.1, 233.12
See application file for complete search history.

(56) References Cited

U.S. PATENT DOCUMENTS

| 7,948,817 B2* | 5/2011 | Coteus et al. ................. 365/194 |
| 2008/0101140 A1 | 5/2008 | Jeong et al. |
| 2011/0187427 A1 | 8/2011 | Kim et al. |

\* cited by examiner

*Primary Examiner* — Huan Hoang

(57) ABSTRACT

A latency control circuit includes a clock delay configured to output a plurality of serial delay signals obtained by serially delaying an input clock signal with the same intervals, a deviation information generating unit configured to generate a deviation information on the basis of a delay value, which the clock signal undergoes in a chip, and latency information, a clock selector configured to output a plurality of clock selection signals based on the plurality of serial delay signals and the deviation information, a command signal processing unit configured to generate a read signal based on an input command signal, and output a variable delay duplication signal by variably delaying the read signal, and a latency shifter configured to output a latency signal by combining the plurality of clock selection signals with the variable delay duplication signal.

23 Claims, 9 Drawing Sheets

LATENCY CONTROL CIRCUIT AND SEMICONDUCTOR DEVICE INCLUDING THE CIRCUIT

CROSS-REFERENCES TO RELATED APPLICATION

The present application claims priority under 35 U.S.C. §119(a) to Korean application number 10-2012-0072954, filed on Jul. 4, 2012, in the Korean Intellectual Property Office, which is incorporated herein by reference in its entirety as set forth in full.

BACKGROUND

1. Technical Field

The present invention relates to a latency control circuit of a semiconductor device.

2. Related Art

Various semiconductor devices (chips) do not operate alone, but operate while sending/receiving data (signals) to/from other peripheral semiconductor devices.

For example, when a memory controller gives a read command to a semiconductor memory device, the semiconductor memory device sends data stored therein to the memory controller. However, the semiconductor memory device cannot send the data to the memory controller as soon as it receives the read command. This is because the semiconductor memory device needs a time to internally call the stored data and prepare outputting of the stored data.

In order that a device A makes interaction with a device B, the device A requests the device B to perform an operation and the device B needs a predetermined standby time until it performs the operation in response to the request. The standby time is called a latency time. For example, when a memory controller gives a read command to a semiconductor memory device, the semiconductor memory devices performs an operation of outputting data after a time as long as column address strobe (CAS) latency CL from when the read command is input thereto.

That is, a read access time tAA is given as the product of CAS latency CL and a clock cycle.

$$tAA = CL \times tCK$$

Latency is required for an interactive operation between the device A and the device B, and a circuit for controlling the latency is called a latency control circuit.

FIG. 1 illustrates a latency control circuit in accordance with the related art.

A command decoder 110 outputs a pulse type of a read signal PREAD by receiving and decoding a read command RD. The read signal PREAD is simultaneously provided to a memory bank 130 and a latency counter 120. A time taken from the read command RD being input to the command decoder 110 to the read signal PREAD being output from the command decoder 110 is called a command decoder delay time tCD.

The latency counter 120 includes a plurality of flip-flops connected in series, and receives the read signal PREAD and outputs a latency signal LATENCY. The number of the flip-flops depends on the CAS latency CL.

A delay locked loop 140 receives a clock signal CK and outputs a delay locked loop clock signal DLLCLK.

A serializer 160 outputs an output data signal DQ fitting to the latency signal LATENCY by sampling and converting data, which is read out from the memory bank 130, into high-speed serial data, in response to the delay locked loop clock signal DLLCLK. The serializer 160 is also called a clock tree, so that a delay time taken by the serializer 160 is called a serializer delay time tCT. The memory bank 130 includes a bit line sense amplifier BLSA, a local sense amplifier LSA, and an input/output (I/O) sense amplifier IOSA. A latency clock generator 150 generates multi-phase sampling clocks LATCK1, LATCK2, . . . , and LATCK(CL-LO) based on the delay locked loop clock signal DLLCLK.

FIG. 2 illustrates a timing diagram of the latency control circuit of FIG. 1. The latency counter 120 compensates for the command decoder delay time tCD and the serializer delay time tCT using the multi-phase sampling clocks LATCK[1:CL-LO].

The reason of compensating for the command decoder delay time tCD and the serializer delay time tCT is as follows. Changes in the command decoder delay time tCD and the serializer delay time tCT depend on changes in manufacturing process, voltage and temperature PVT. Therefore, it is necessary to compensate for the command decoder delay time tCD and the serializer delay time tCT in an internal circuit such that the changes are not exposed to the outside, in order to satisfy a formula relating to the read access time tAA. The interval between pulses in each of the multi-phase sampling clocks LATCK[1:CL-LO] is generally smaller than one clock cycle tCK of the clock signal CK, and the sum of differences between the intervals and the clock cycle tCK becomes the same as the sum of the command decoder delay time tCD and the serializer delay time tCT.

When a minimum data delay value from data input to data output of a flip-flop in the latency counter 120 is defined as a shifting delay of the flip-flop, the shifting delay is the same as the sum of a setup time tSETUP of the flip-flop and a clock-to-q delay tCLK2Q of the flip-flop. That is, the shifting delay is described as follows.

$$\text{Shifting delay} = tSETUP + tCLK2Q$$

Therefore, a time taken from the read signal PREAD being input to the latency counter 120 to the latency signal LATENCY being output from the latency counter 120 is the same as the sum of the shifting delays of the flip-flops in the latency counter 120.

As a result, the latency control circuit forms a path for outputting the output data signal DQ after receiving the read command RD, and a total delay time Dtotal of the latency control circuit, which is generated in the entire path, is described as follows.

$$Dtotal = tCD + (\text{sum of shifting delays of flip-flops}) + tCT$$

Meanwhile, the total delay time Dtotal should be smaller than the read access time (tAA=CL×tCK). That is, $$Dtotal < (CL \times tCK).$$

However, as a semiconductor device is stabilized after the specifications thereof are fixed, a data rate increases and a clock cycle tCK decreases. Therefore, it is difficult to satisfy the above formula when the CAS latency CL increases. That is, it is difficult to maintain the total delay time Dtotal to be smaller than CL×tCK. In particular, the lower a supply power, the larger values of the command decoder delay time tCD, the shifting delay of the flip-flop, and the serializer delay time tCT, so that it is more difficult to satisfy the above formula.

SUMMARY

An embodiment of the present invention provides a latency control circuit that can compensate for a command decoder delay time.

Further, another embodiment of the present invention provides a latency control circuit that can compensate for a command decoder delay time and a clock buffer delay time.

Further, still another embodiment of the present invention provides a latency control circuit that can compensate for a command decoder delay time, a clock buffer delay time, and a serializer delay time.

In one embodiment of the present invention, a latency control circuit includes: a clock delay configured to output a plurality of serial delay signals obtained by serially delaying input clock signals with the same intervals; a deviation information generator configured to generate deviation information on the basis of a delay value excluding a command decoder delay time from a delay value that the clock signal undergoes in a chip, and latency information; a clock selector configured to output a plurality of clock selection signal, using the plurality of serial delay signals and the deviation information; a command signal processor configured to generate a read command, using an input read signal, and outputs a variable delay duplication signal by variably delaying a generated clock buffer output signal; and a latency shifter configured to outputs a latency signal by combining a plurality of clock selection signals output from the clock selector with a variable delay duplication signal output from the command signal processor.

The clock delay serial includes a divider configured to output a division signal by dividing the input clock signal; and a plurality of serial delays connected in series to divide and serially delay the division signal and output serially delayed serial delay signals.

The latency control circuit further includes: a first clock buffer disposed at the front end of the clock delay and configured to buffer the clock signal; and a first variable delay duplicator configured to output a delay clock signal by delaying a buffered clock signal output from the first clock buffer as much as a variable delay time.

The clock selector includes: an even-numbered clock selection signal generator configured to output a plurality of even-numbered clock selection signals by locally combining the serial delay signals and the deviation signal; and an odd-numbered clock selection signal generator configured to output odd-numbered clock selection signals by inverting the even-numbered clock selection signals.

The clock selector includes: an even-numbered clock selection signal generator configured to output a plurality of even-numbered clock selection signals with the serial delay signals as input and the deviation signal as a control signal; and an odd-numbered clock selection signal generator configured to output odd-numbered clock selection signals by inverting the even-numbered clock selection signals.

The latency shifter includes: a first flip-flop group configured to include a plurality of flip-flops connected in series in order to delay the variable delay duplication signal in synchronization with the even-numbered clock selection signal; a second flip-flop group configured to include a plurality of flip-flops connected in series in order to delay the variable delay duplication signal in synchronization by the odd-numbered clock selection signal; a first input selector configured to selectively input the variable delay duplication signal; a to any one flip-flop in the first flip-flop group; a second input selector configured to selectively input the variable delay duplication signal to any one flip-flop in the second flip-flop group; a first output selector configured to select and output the output of any one flip-flop in the first flip-flop group; a second output selector configured to select and output the output of any one flip-flop in the second flip-flop group; a first different mode delay configured to delay the output of the first output selector for a predetermined time and then output the output of the first output selector, when the deviation signal is an odd number; a second different mode delay configured to delay the output of the second output selector for a predetermined time and then output the output of the second output selector, when the deviation signal is an odd number; and an output processor configured to pass the output of the first different mode delay and the second different mode delay.

The first and second flip-flop groups include flip-flops disposed to ensure the minimum delay time generated by latency of the chip.

The command signal processor includes: a second clock buffer configured to output a buffered command signal by buffering the command signal; a command decoder configured to decode and output the buffered command signal as a pulse type of signal; and a second variable delay duplicator configured to output a variable delay duplication signal by delaying the pulse type of signal as much as the delay time by the first variable delay duplicator.

In another embodiment, a latency control circuit includes: a clock buffer configured to buffer an input clock signal; a first variable delay duplicator configured to a variable delay clock by delaying a buffered clock signal output from the clock buffer for a variable delay time; a clock delay configured to output a plurality of serial delay signals obtained by serially delaying the variable delay clocks with the same intervals; a deviation information generator configured to generate deviation information on the basis of a delay value excluding a command decoder delay time from a delay value that the clock signal undergoes in a chip, and latency information; a clock selector configured to output a plurality of clock selection signals, using the plurality of serial delay signals and the deviation signal; a command decoder configured to output a pulse type of read signal, using an input command signal; a second variable delay duplicator configured to output a variable delay duplication signal by delaying the pulse type of read signal for a delay time by the first variable delay duplicator; and a latency shifter configured to output a latency signal by combining a plurality of clock selection signals output from the clock selector with a variable delay duplication signal output from the command signal processor.

According to a latency control circuit in an embodiment of the present invention, it is possible to support supply various data rates and various supply voltages by compensating for a command decoder delay time, a clock buffer delay time, and a serializer delay time. Therefore, it is possible to support various CAS latencies.

BRIEF DESCRIPTION OF THE DRAWINGS

Features, aspects, and embodiments are described in conjunction with the attached drawings, in which.

DETAILED DESCRIPTION

Figure 1:
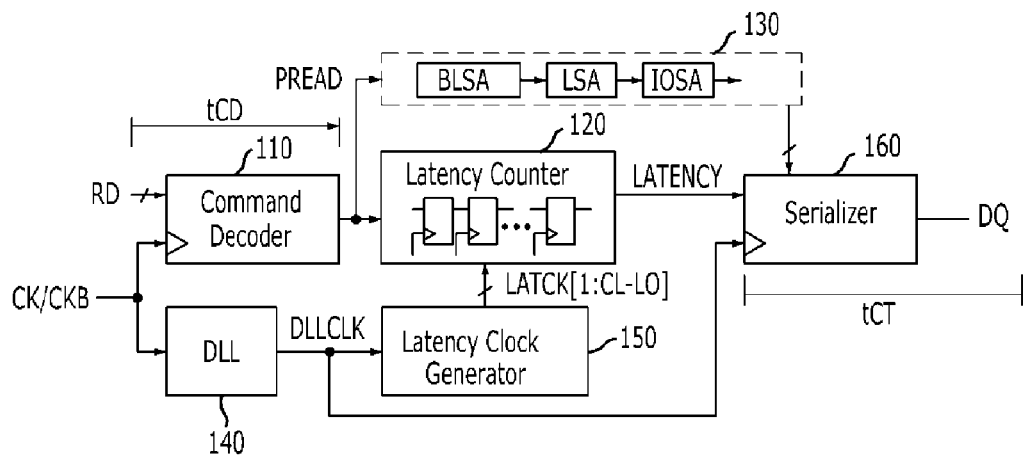
FIG. 1 illustrates a latency control circuit in accordance with the related art.
Figure 2:
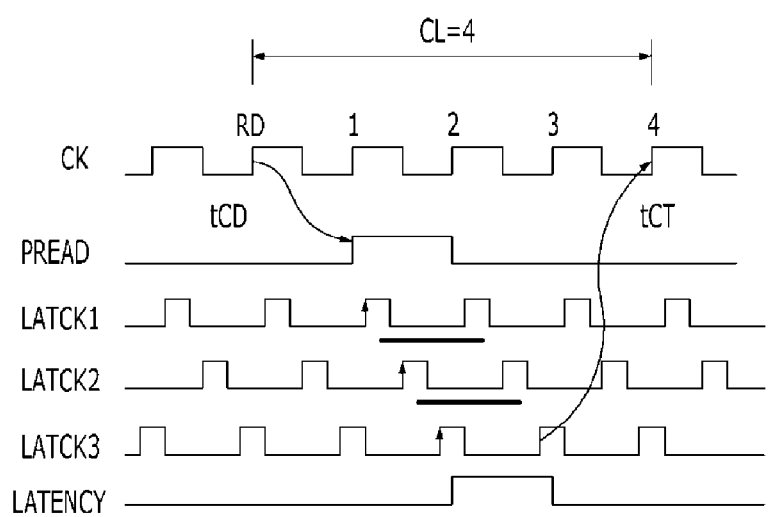
FIG. 2 is a timing diagram of the latency control circuit of FIG. 1.

Hereinafter, a semiconductor apparatus and a calibration method thereof in accordance with the present invention will be described with reference to the accompanying drawings through embodiments.

Hereinafter, embodiments of the present invention are described in detail with reference to the accompanying drawings. First, in the specification, in adding reference numerals to components throughout the drawings, it is to be noted that like reference numerals designate like components even though components are illustrated in different drawings. Further, although specific details are described below, they are provided only for assisting in the entire understanding of the present invention. Therefore, it will be apparent to those skilled in the art that the present invention can be implemented without the specific details. Further, in describing the present invention, detailed descriptions of well-known functions or configurations relating to the present invention will not be provided so as not to obscure the description of the present invention with unnecessary details.

Figure 3:
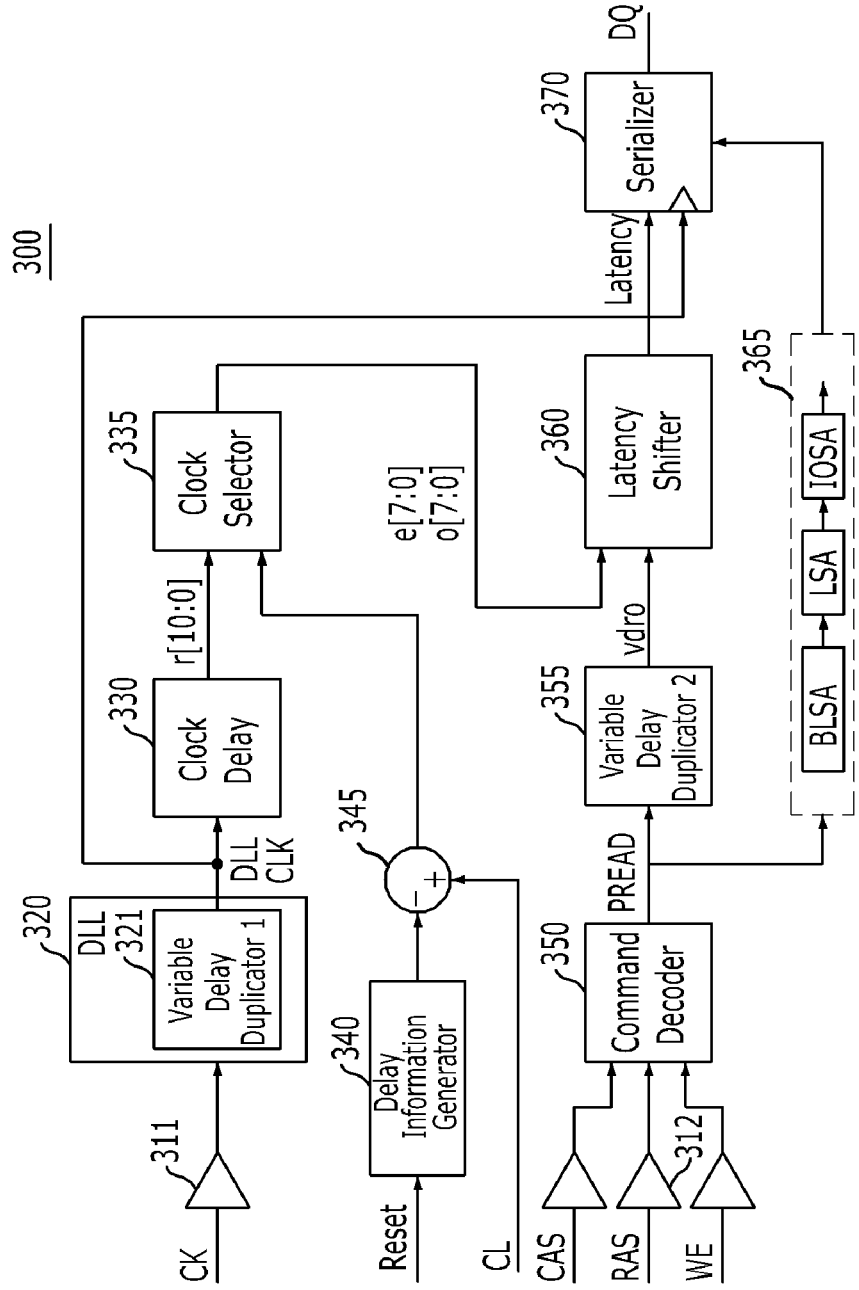
FIG. 3 illustrates a latency control circuit in accordance with an embodiment of the present invention.

FIG. 3 illustrates a latency control circuit 300 in accordance with an embodiment of the present invention.

Referring to FIG. 3, a first clock buffer 311 buffers an input clock signal CK and outputs a buffered clock signal that is obtained by delaying the input clock signal CK as much as a clock buffer delay time tCB.

A delay locked loop 320 includes a first variable delay duplicator 321, and the first variable delay duplicator 321 receives the buffered clock signal and outputs a delay clock signal DLLCLK obtained by delaying the buffered clock signal as much as a variable delay time tVD.

A clock delay 330 (clock delay block 330) outputs a plurality of serial delay signals r[10:0] obtained by serially delaying the delay clock signal DLLCLK. The clock delay 330 generates equal division delay signals r[1], ..., and r[10], which are serially delayed, by equally dividing a command decoder delay time tCD into ten.

Therefore, the sum of delay times of the serial delay signals r[1] to r[10] is the same as the decoder delay time tCD. Assuming that a delay time from the input of the delay clock signal DLLCLK to the output of the serial delay signal r[0] is '0', a delay time from the clock signal CK to the serial delay signal r[10] is the sum of a clock buffer delay time tCB, the variable delay time tVD, and the command decoder delay time tCD.

A delay information generator 340 receives a measurement signal Reset and outputs a delay value with the command decoder delay time tCD that the clock signal CK undergoes in a chip, as delay information N. A subtractor 345 outputs a deviation signal CL-N by calculating a difference between the CAS latency CL and the delay information N. The CAS latency CL is generated on the basis of signals, which include a CAS signal CAS and a row address strobe (RAS) signal RAS, applied from the outside.

A clock selector 335 outputs a plurality of clock selection signals e[7:0] and o[7:0], using the deviation signal CL-N from the subtractor 345 and the serial delay signals r[10:0] from the clock delay 330.

A command decoder 350 outputs a pulse type of a read signal PREAD on the basis of the CAS signal CAS and the RAS signal RAS, and the write enable signal WE. A second variable delay duplicator 355 outputs a variable delay duplication signal vdro by delaying the read signal PREAD as much as the variable delay time tVD delayed by the first variable delay duplicator 321.

A latency shifter 360 outputs a latency signal Latency by combining the odd-numbered and even-numbered clock selection signals e[7:0] and o[7:0] output from the clock selector 335 with the variable delay duplication signal vdro output from the second variable delay duplicator 355.

A serializer 370 outputs an output data signal DQ fitting to the latency signal LATENCY by sampling and converting data, which is read out from a memory bank 365, into high-speed serial data, in response to the delay clock signal DLLCLK from the delay locked loop 320.

Figure 4:
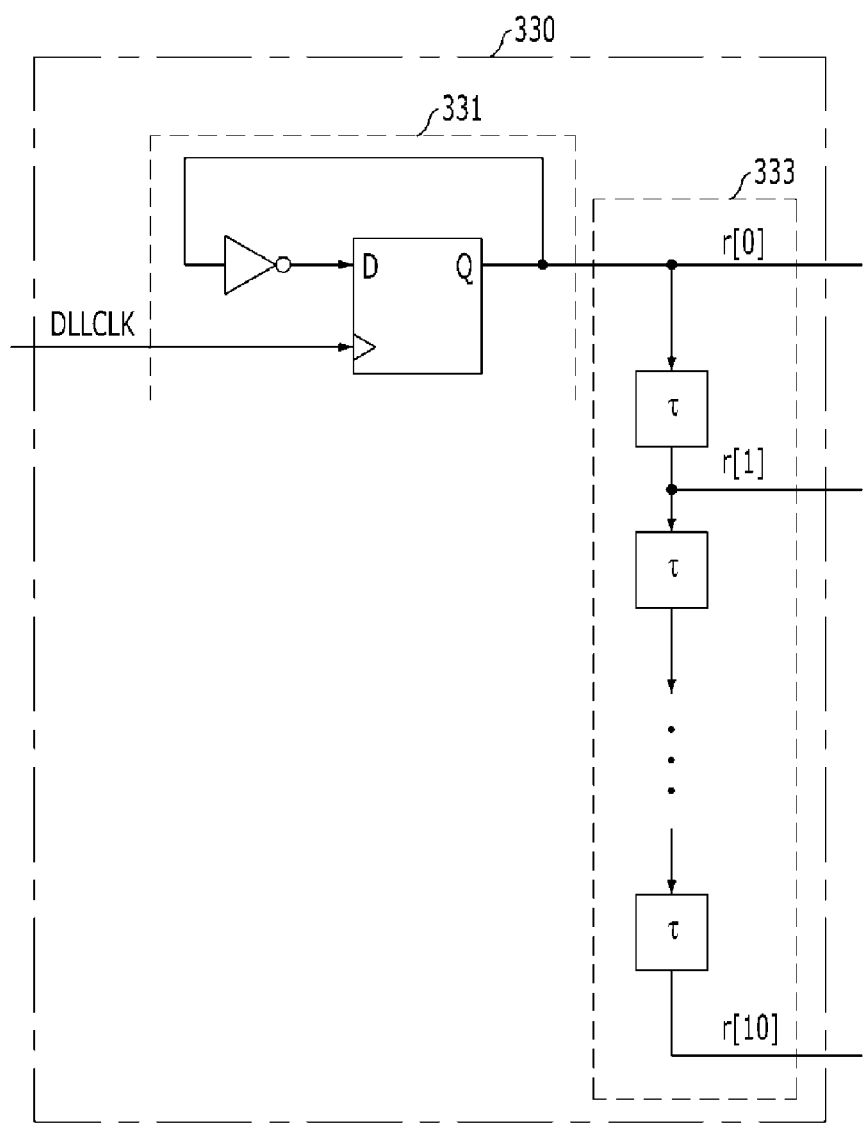
FIG. 4 illustrates a detailed circuit diagram of a clock delay in accordance with an embodiment of the present invention.

FIG. 4 illustrates a detailed circuit diagram of the clock delay 330 in accordance with an embodiment of the present invention.

Referring to FIG. 4, the clock delay 330 includes a 2-divider 331 and ten equal division delays 333 (ten equal division delay block 333). The 2-divider 331 outputs a 2-division signal r[0] by 2-dividing the delay clock signal DLLCLK inputted thereto. The ten equal division delays 333 connected in series output ten equal division delay signals r[1], ..., and r[10], which are serially delayed, by equally dividing the command decoder delay time tCD into ten. The ten equal division delays 333 may be implemented by one buffer or a plurality of buffers. Meanwhile, in accordance with another embodiment of the present invention, it is apparent to those skilled in the art that the divider 333 may not be necessary if a 2-divider and a 4-divider are used.

Figure 5:
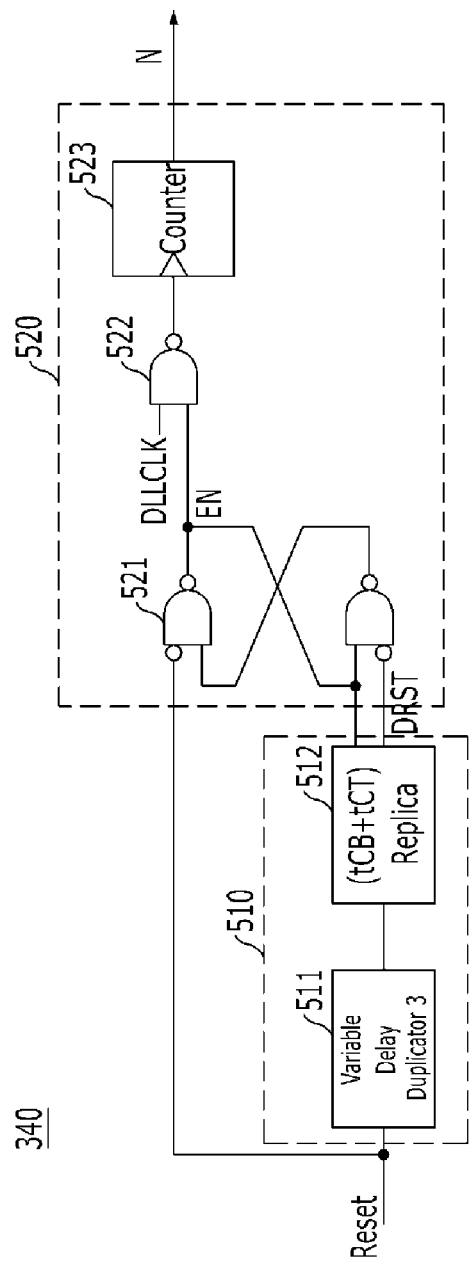
FIG. 5 illustrates a detailed circuit diagram of a delay information generator in accordance with an embodiment of the present invention.

FIG. 5 illustrates a detailed circuit diagram of the delay information generator 340 in accordance with an embodiment of the present invention.

The delay information generator 340 measures the delay value with the command decoder delay time tCD that the clock signal CK undergoes in the chip, for each clock, and outputs a counted number N of corresponding clocks.

Referring to FIG. 5, the delay information generator 340 includes a measurement delay 510 (measurement delay block 510) that delays the measurement signal Reset as much as the delay value excluding the command decoder delay time tCD from the delay value that is undergone in the chip, and a counting unit 520 that counts activation times of the delay clock signal DLLCLK for a period from a point of time when the measurement signal Reset is activated to a point of time when the output signal DRST of the measurement delay 510 is activated, and outputs the number of activation times as the counted number N.

The measurement delay 510 includes a third variable delay duplicator 511 and a replica delay line 512, which delay the measurement signal Reset. The third variable delay duplicator 511 has the same configuration as the first variable delay duplicator 321 in the delay locked loop 320, and the replica delay line 512 has a delay value that is the same as that of a replica delay line in the delay locked loop 320, the delay value of the replica delay line 512 being the sum of the clock buffer delay time tCB and a serializer delay time tCT. That is, the sum of the delay value of the third variable delay duplicator 511 and the delay value of the replica delay line 512 is the same as the delay value excluding the command decoder delay time tCD from the delay value that the clock signal CK undergoes in the chip.

The counting unit 520 counts the activation times of the delay clock signal DLLCLK for the period from the time point when the measurement signal Reset is activated to the time point when the output signal DRST of the measurement delay 510 is activated. The counting unit 520 includes an SR latch 521, a NAND gate 522, and a counter 523. In an operation, when the measurement signal Reset is activated, an output signal EN of the SR latch 521 is activated to 'high', so that the delay clock signal DLLCLK is transferred to the counter 523. After that, if the output signal DRST of the measurement delay unit 510 is activated, and the output signal EN of the SR latch 521 is inactivated to 'low', an output value of the NAND gate 522 is fixed to 'low'. As a result, the counting of the counter 523 is completed. That is, the counter 523 outputs the counted number N representing the activation times of the delay clock signal DLLCLK that is activated from the time point when the measurement signal Reset input to the measurement delay 510 is activated and the time point when the output signal DRST of the measurement delay 510 is activated. The output signal N of the delay information generator 340 is a value converted from a delay value with the command decoder delay time tCD that the clock signal CK undergoes in the chip, for each clock.

The measurement signal Reset is a signal for measuring a delay value, and the delay value of the third variable delay duplicator 511 is determined after locking of the delay locked loop 320, so that a signal that is activated after the locking of the delay locked loop 320 may be used as the measurement signal Reset.

Figure 6:
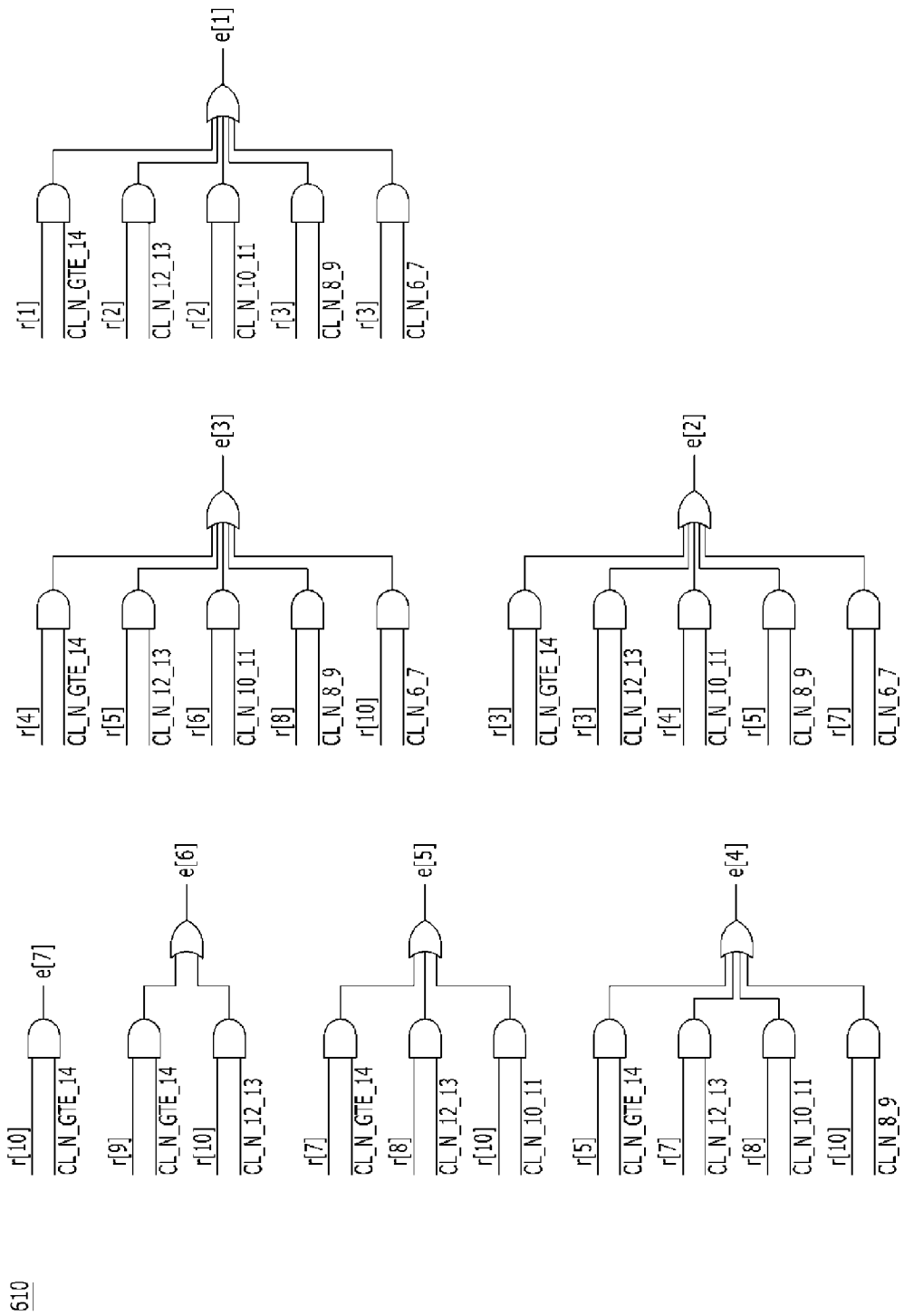
FIG. 6 illustrates a detailed circuit diagram of a clock selector in accordance with an embodiment of the present invention.

FIG. 6 illustrates a detailed circuit diagram of the clock selector 335 in accordance with an embodiment of the present invention.

Referring to FIG. 6, the clock selector 335 includes an even-numbered clock selection signal generator 610 that outputs the even-numbered clock selection signals e[7:0] by logically combining the serial delay signals r[10:0] with the deviation signal CL-N, and an odd-numbered clock selection signal generator (not illustrated) that is composed of a plurality of inverters that outputs the odd-numbered clock selection signals o[7:0] by inverting the even-numbered clock selection signals e[7:0].

For example, if the deviation signal CL-N is 14 or more, the serial delay signal r[10] is output as the even-numbered clock selection signal e[7]. Further, if the deviation signal CL-N is 14 or more, the serial delay signal r[9] is output as the even-numbered clock selection signal e[6], or if the deviation signal CL-N is 12 or 13, the serial delay signal r[10] is output as the even-numbered clock selection signal e[6]. In this manner, the even-numbered clock selection signals e[7:0] can be generated. Even though it is not illustrated, the serial delay signal r[0] is always output as the even-numbered clock selection signal e[0].

The method of selecting an even-numbered clock selection signal e[k] from a serial delay signal r[m] follows the following formula, and the resultant values are shown in Table 1.

$$e[k]=r[m],\ 0 \leq k \leq 7,\ \text{and}$$

$$m=<10/7*k>,$$

where, in $<10/7*k>$, 10 represents the number of equal division delays obtained by equally dividing the command decoder delay time tCD, 7 represents a value obtained by subtracting 1 from the number of even-numbered clock selection signals e[k], and $<>$ means round-off.

TABLE 1

| | | CL-N | | | | |
|---|---|---|---|---|---|---|
| e[k] | ≥14 | 13, 12 | 11, 10 | 9, 8 | 7, 6 |
| e[7] | <10/7 * 7> = 10 | | | | |
| e[6] | <10/7 * 6> = 9 | <10/6 * 6> = 10 | | | |
| e[5] | <10/7 * 5> = 7 | <10/6 * 5> = 8 | <10/5 * 5> = 10 | | |
| e[4] | <10/7 * 4> = 5 | <10/6 * 4> = 7 | <10/5 * 4> = 8 | <10/4 * 4> = 10 | |
| e[3] | <10/7 * 3> = 4 | <10/6 * 3> = 5 | <10/5 * 3> = 6 | <10/4 * 3> = 8 | <10/3 * 3> = 10 |
| e[2] | <10/7 * 2> = 3 | <10/6 * 2> = 3 | <10/5 * 2> = 4 | <10/4 * 2> = 5 | <10/3 * 2> = 7 |
| e[1] | <10/7 * 1> = 1 | <10/6 * 1> = 2 | <10/5 * 1> = 2 | <10/4 * 1> = 3 | <10/3 * 1> = 3 |
| e[0] | <10/7 * 0> = 0 | <10/6 * 0> = 0 | <10/5 * 0> = 0 | <10/4 * 0> = 0 | <10/3 * 0> = 0 |

Figure 7:
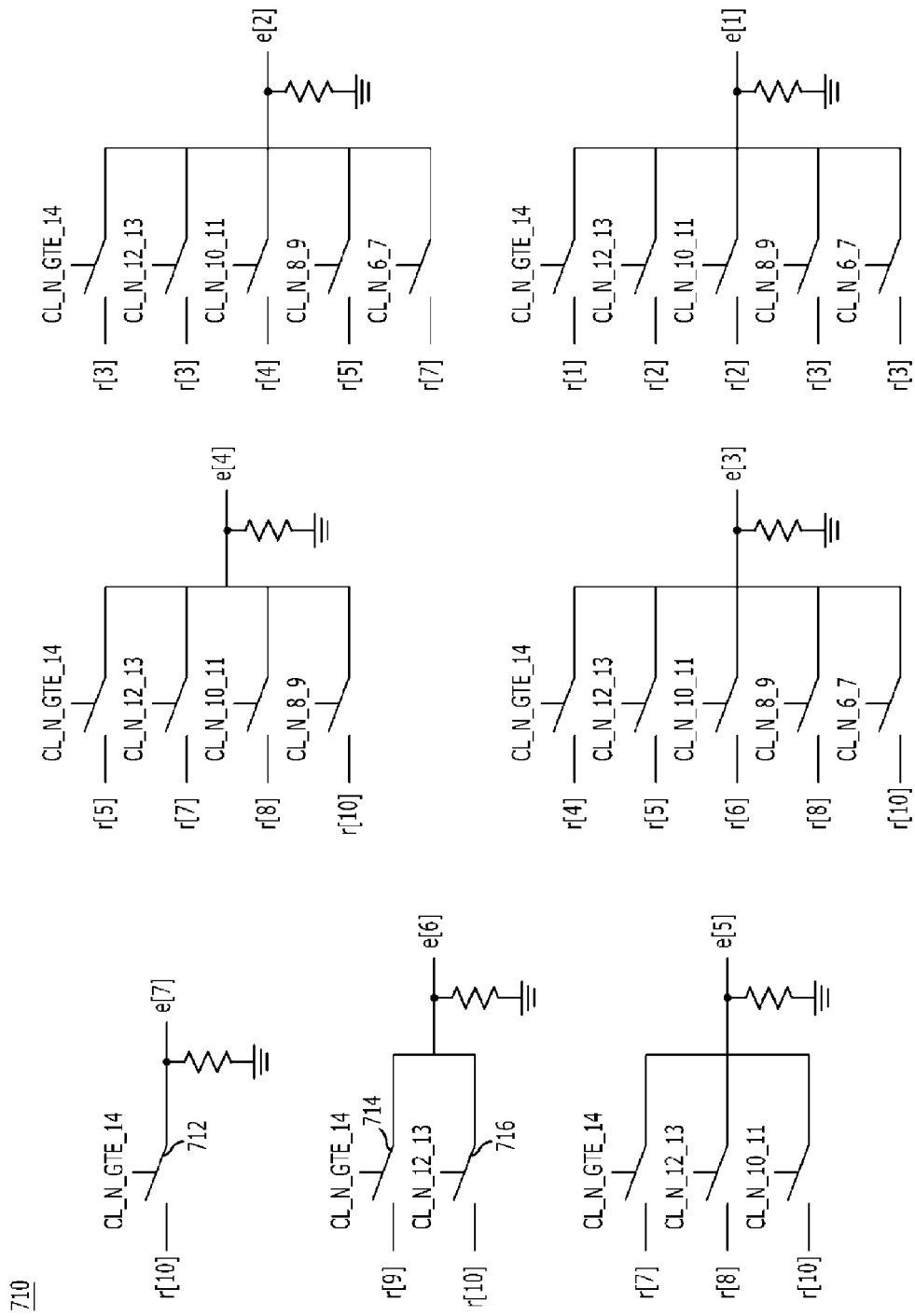
FIG. 7 illustrates a detailed circuit diagram of a clock selector in accordance with another embodiment of the present invention.

FIG. 7 illustrates a detailed circuit diagram of the clock selector 335 in accordance with another embodiment of the present invention.

Referring to FIG. 7, the clock selector 335 includes an even-numbered clock selection signal generator 710, which outputs the even-numbered clock selection signals e[7:0] using the serial delay signals r[10:0] as inputs and the deviation signal CL-N as a control signal, and an odd-numbered clock selection signal generator (not illustrated), which is composed of a plurality of inverters that outputs the odd-numbered clock selection signals o[7:0] by inverting the even-numbered clock selection signals e[7:0].

For example, the even-numbered clock signal e[7] is output using a switching device 712 that receives the serial delay signal r[10] as an input and is controlled by a deviation signal CL-N of 14 or more. Further, the even-numbered clock selection signal e[6] is output using a switching device 714 that receives the serial delay signal r[9] as an input and is controlled by the deviation signal CL-N of 14 or more and a switching device 716 that receives the serial delay signal r[10] as an input and is controlled by a deviation signal CL-N of 12 or 13. In this manner, the even-numbered clock selection signals e[7:0] can be output. Even though it is not illustrated, the serial delay signal r[0] is always output as the even-numbered clock selection signal e[0].

The configurations of FIGS. 6 and 7 and operations thereof are apparent to those skilled in the art, and thus their detailed description is omitted.

Figure 8:
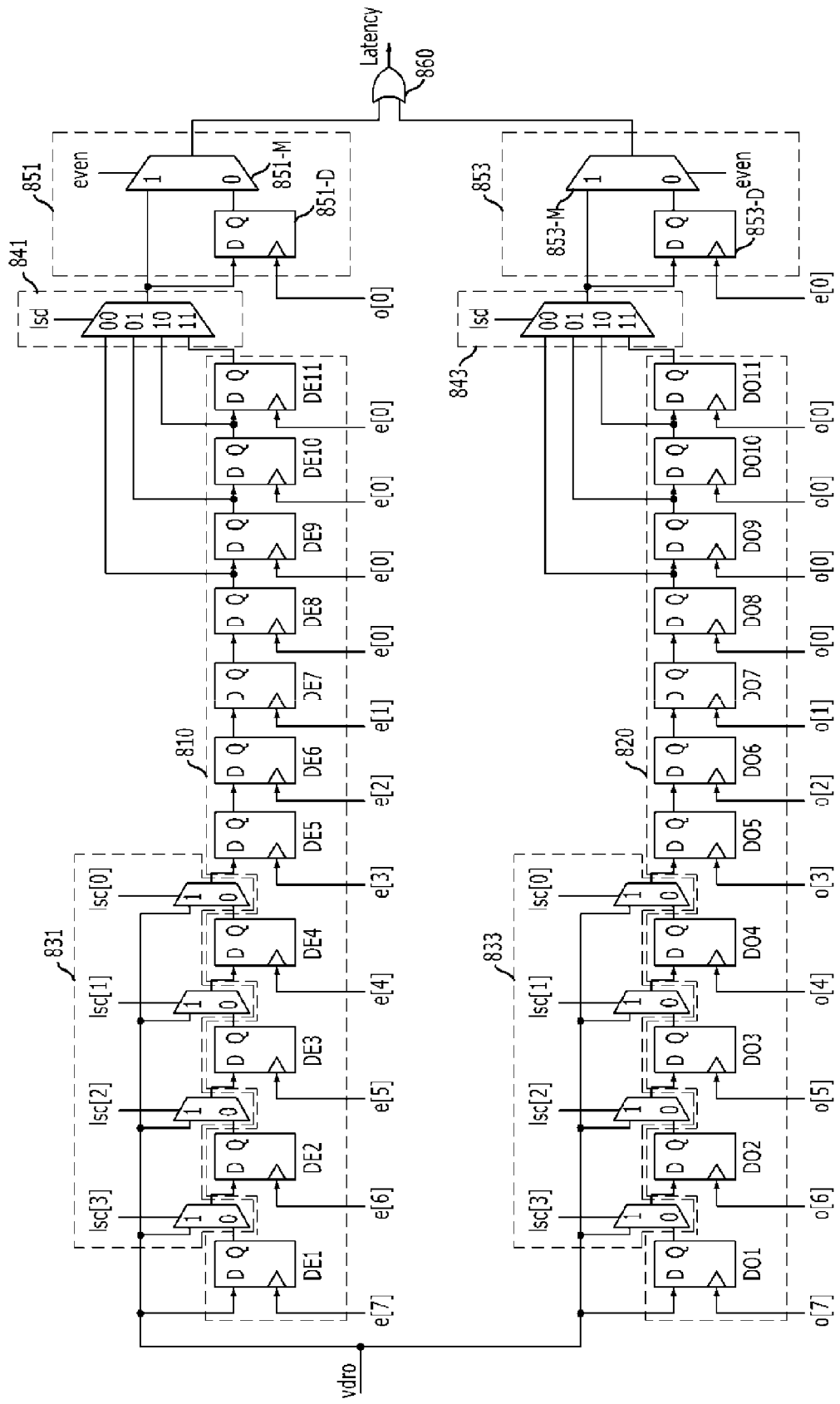
FIG. 8 illustrates a detailed circuit diagram of a latency shifter in accordance with an embodiment of the present invention.

FIG. 8 illustrates a detailed circuit diagram of the latency shifter 360 in accordance with an embodiment of the present invention.

Referring to FIG. 8, the latency shifter 360 includes a first D-flip-flop group 810 including a plurality of D-flip-flops connected in series, a second D-flip-flop group 820 including a plurality of D-flip-flops connected in series, a first input selector 831, a second input selector 833, a first output selector 841, a second output selector 843, a first different mode delay 851, a second different mode delay 853, and an output processor 860.

The plurality of D-flip-flops connected in series in the first D-flip-flop group 810 operates in synchronization with the even-numbered clock selection signals e[7:0], respectively, and the plurality of D-flip-flops connected in series in the second D-flip-flop group 820 operates in synchronization with the odd-numbered clock selection signals o[7:0].

The first input selector 831 selectively inputs the variable delay duplication signal vdro to one of the second to fifth flip-flops (DE2 to DE5, respectively) in the first D-flip-flop group 810 in response to latency shift control signals Isc[3:0], and the second input selector 833 selectively input the variable delay duplication signal vdro to one of the second to fifth flip-flops (DO2 to DO5, respectively) in the second D-flip-flop group 820 in response to the latency shift control signals Isc[3:0].

The first output selector 841 selects one of outputs of the eighth to eleventh D-flip-flops (DE8 to DE11, respectively) in the first D-flip-flop group 810 in response to latency shift delay signals Isd[1:0], and the second output selector 843 selects one of outputs of the eighth to eleventh D-flip-flops (DO8 to DO11, respectively) in the second D-flip-flop group 820 in response to the latency shift delay signals Isd[1:0].

The first different mode delay 851 outputs an output of the first output selector 841 through a D flip-flop 851-D when the deviation signal CL-N has an odd number, and the second different mode delay 853 outputs an output of the second output selector 843 through a D flip-flop 853-D when the deviation signal CL-N has an odd number. The first different mode delay 851 includes the D flip-flop 851-D configured to output the output of the first output selector 841 as a data signal using the odd-numbered clock selection signal o[0] as a clock signal, and a multiplexer 851-M configured to output the output of the D flip-flop 851-D when the deviation signal CL-N has an odd number and output the output of the first output selector 841 when the deviation signal CL-N is an even number through the use of the output of the first output selector 841 and the output of the D F/F(851-D) as inputs and the deviation signal CL-N as a control signal.

The output processor 860 performs a logical sum operation on an output of the first different mode delay 851 and an output of the second different mode delay 853 and can pass the variable delay duplication signal vdro that is transmitted through any path of an upper path (831, 810, 841, and 851) and a lower path (833, 820, 843, and 853) in FIG. 8. Meanwhile, the output processor 860 may be implemented with an OR-gate.

For example, if the deviation signal CL-N is 14 or more, as shown in Table 2, all of the latency shift control signals Isc[3:0] are 0 (i.e., "0000"), so that the variable delay duplication signal vdro is input to the first D-flip-flops DE1 and DO1 and delayed. If the deviation signal CL-N is 21, the latency shift delay signals Isd[1:0] is "11", the first output selector 841 selects the output of the eleventh D-flip-flop DE11, and the second output selector 843 selects the output of the eleventh D-flip-flop DO11. Further, since the CAS latency CL has an odd number, a mode signal even becomes "0". Therefore, if the variable delay duplication signal vdro passes the first D-flip-flop group 810, the output of the first output selector 841 is output as the latency information Latency through the D flip-flop 851-D in the first different mode delay 851. On the other hand, if the variable delay duplication signal vdro passes the second D-flip-flop group 820, the output of the second output selector 843 is output as the latency information Latency through the D flip-flop 853-D in the second different mode delay 853.

The fifth to seventh D-flip-flops DE5 to DE7 and DO5 to DO7 are configured to ensure a minimum delay time that is generated by latency.

Meanwhile, the latency shift control signals Isc[3:0], the latency shift delay signals Isd[1:0], and the mode signal even can be determined by a method shown in the following table 2. Therefore, referring to Table 2, it is noted that, as the deviation signal CL-N increases, the variable delay duplication signal vdro passes larger numbers of the D-flip-flops in the first and second D-flip-flop groups 810 and 820.

TABLE 2

| CL-N | Isc[3:0] | Isd[1:0] | Even |
|------|----------|----------|------|
| 21   | 0000     | 11       | 0    |
| 20   | 0000     | 11       | 1    |
| 19   | 0000     | 10       | 0    |
| 18   | 0000     | 10       | 1    |
| 17   | 0000     | 01       | 0    |
| 16   | 0000     | 01       | 1    |
| 15   | 0000     | 00       | 0    |
| 14   | 0000     | 00       | 1    |
| 13   | 1000     | 00       | 0    |
| 12   | 1000     | 00       | 1    |
| 11   | 0100     | 00       | 0    |
| 10   | 0100     | 00       | 1    |
| 9    | 0010     | 00       | 0    |
| 8    | 0010     | 00       | 1    |
| 7    | 0001     | 00       | 0    |
| 6    | 0001     | 00       | 1    |

Figure 9:
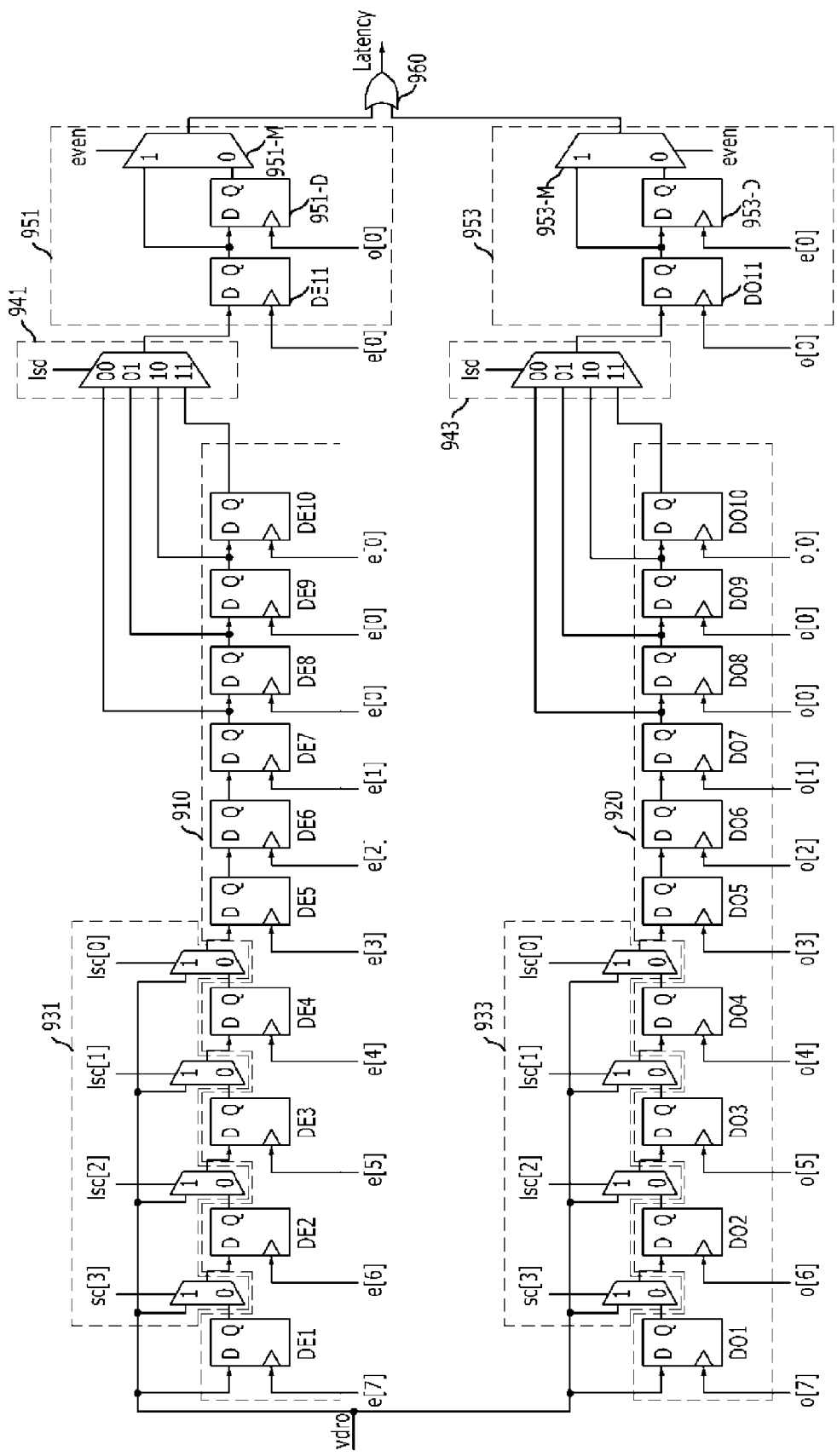
FIG. 9 illustrates a detailed circuit diagram of a latency shifter in accordance with another embodiment of the present invention.

FIG. 9 illustrates a detailed circuit diagram of the latency shifter 360 in accordance with another embodiment of the present invention. Most of configurations in FIG. 9 are the same as those in FIG. 8 except that the eleventh D-flip-flop DE11 in the first D-flip-flop group 810 is moved into a first different mode delay 951 and the eleventh D-flip-flop DO11 in the second D-flip-flop group 820 is moved into a second different mode delay 953.

In the above embodiments shown in FIGS. 8 and 9, although the D-flip-flops are used in the latency shifter, any flip-flops can be used if they have the same function as the D flip-flop.

Figure 10:
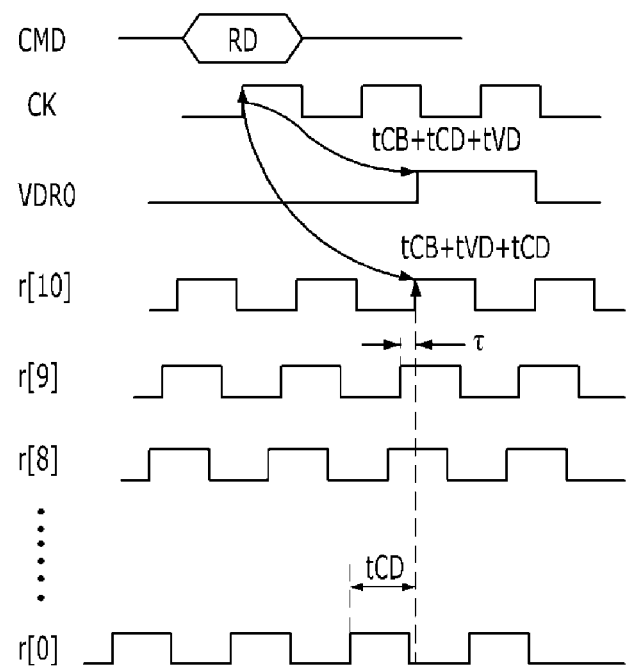
FIG. 10 illustrates a timing diagram of a latency control circuit in accordance with an embodiment of the present invention.

FIG. 10 illustrates a timing diagram of a latency control circuit in accordance with an embodiment of the present invention.

An activation point of time of the variable delay duplication signal vdro that is input to the latency shifter 360 may be determined by considering the clock buffer delay time tCB, the variable delay time tVD, and the command decoder delay time tCD according to the delay signal CL-N.

That is, the clock buffer delay time tCB in the first clock buffer 311 is the same as that of a second clock buffer 312. The variable delay time tVD in the first variable delay duplicator 321 is the same as that in the second variable delay duplicator 355. Finally, the command decoder delay time tCD according to the deviation signal CL-N in the clock delay 330, the clock selector 335, and the latency shifter 360 is the same as that in the command decoder 350.

Therefore, the variable delay duplication signal vdro can compensate for 'clock buffer delay time tCB+variable delay time tVD+command decoder delay time tCD according to deviation signal CL-N'.

Although detailed embodiment(s) were described above in the detailed description of the present invention, the present invention may be modified in various ways without departing from the scope of the present invention. Therefore, the scope of the present invention should not be limited to the embodiment(s), but should be determined by not only the following claims, but equivalents of the claims.

While certain embodiments have been described above, it will be understood to those skilled in the art that the embodiments described are by way of example only. Accordingly, the device described herein should not be limited based on the described embodiments. Rather, the device described herein should only be limited in light of the claims that follow when taken in conjunction with the above description and accompanying drawings.

What is claimed is:

1. A latency control circuit comprising:
   a clock delay configured to output a plurality of serial delay signals obtained by serially delaying an input clock signal with the same intervals;
   a deviation information generating unit configured to generate a deviation signal on the basis of a delay value excluding a command decoder delay time from a delay time that the input clock signal undergoes in a chip, and latency information;
   a clock selector configured to generate a plurality of clock selection signals based on the plurality of serial delay signals and the deviation information;
   a command signal processing unit configured to generate a read signal based on an input command signal, and output a variable delay duplication signal by variably delaying the read signal; and
   a latency shifter configured to output a latency signal by combining the plurality of clock selection signals output from the clock selector with the variable delay duplication signal output from the command signal processing unit.

2. The latency control circuit of claim 1, wherein the clock delay includes:
   a divider configured to output a division signal by dividing the input clock signal; and
   a plurality of division delays connected in series and configured to serially delay the division signal and output the plurality of serial delay signals.

3. The latency control circuit of claim 1, further comprising:
   a first clock buffer disposed at the front end of the clock delay and configured to buffer a clock signal and output a buffered clock signal; and
   a first variable delay duplicator configured to output the input clock signal by delaying the buffered clock signal as much as a variable delay time.

4. The latency control circuit of claim 1, wherein the deviation information generating unit includes:
   a delay information generator configured to measure the delay value with the command decoder delay time for each clock, and to output a counted number obtained by counting measured clocks; and
   a subtractor configured to output a difference between the latency information and the counted number as the deviation signal.

5. The latency control signal of claim 2, wherein the clock selector includes:
   an even-numbered clock selection signal generator configured to generate a multiplicity of even-numbered clock selection signals by logically combining the serial delay signals and the deviation signal; and
   an odd-numbered clock selection signal generator configured to generate a multiplicity of odd-numbered clock selection signals by inverting the even-numbered clock selection signals,
   wherein the plurality of clock selection signals includes the even-numbered clock selection signals and the odd-numbered clock selection signals.

6. The latency control signal of claim 5, wherein the serial delay signals and the even-numbered clock selection signals are determined as follows:

$$e[k]=r[m],\ 0 \le k \le 7,\ \text{and}$$

$$m=<10/7*k>,$$

wherein $r[m]$ represents a serial delay signal, and $e[k]$ represents an even-numbered clock selection signal, and wherein, in $<10/7*k>$, 10 represents the number of the serial delay signals, 7 represents a value obtained by subtracting 1 from the number of the even-numbered clock selection signals, and $<\ >$ means round-off.

7. The latency control signal of claim 2, wherein the clock selector includes:
   an even-numbered clock selection signal generator including a plurality of switches that receive the serial delay signals as inputs and are controlled by the deviation signal and configured to generate a multiplicity of even-numbered clock selection signals according to selective activation of the switches; and
   an odd-numbered clock selection signal generator configured to generate a multiplicity of odd-numbered clock selection signals by inverting the even-numbered clock selection signals.

8. The latency control signal of claim 7, wherein the serial delay signals and the even-numbered clock selection signals are determined as follows:

$$e[k]=r[m],\ 0 \le K \le 7,\ \text{and}$$

$$m=<10/7*k>,$$

wherein $r[m]$ represents a serial delay signal, and $e[k]$ represents an even-numbered clock selection signal, and wherein, in $<10/7*k>$, 10 represents the number of the serial delay signals, 7 represents a value obtained by subtracting 1 from the number of the even-numbered clock selection signals, and $<\ >$ means round-off.

9. The latency control circuit of claim 5, wherein the latency shifter includes:
   a first flip-flop group including a plurality of flip-flops, which are connected in series and configured to delay the variable delay duplication signal in synchronization with the even-numbered clock selection signals;
   a second flip-flop group including a plurality of flip-flops, which are connected in series and configured to delay the variable delay duplication signal in synchronization with the odd-numbered clock selection signals;
   a first input selector configured to selectively input the variable delay duplication signal to one flip-flop in the first flip-flop group;
   a second input selector configured to selectively input the variable delay duplication signal to one flip-flop in the second flip-flop group;
   a first output selector configured to select and output one of outputs of the flip-flops in the first flip-flop group;
   a second output selector configured to select and output one of outputs of the flip-flops in the second flip-flop group;
   a first different mode delay configured to delay an output of the first output selector for a predetermined time and output said delayed output when the deviation signal has an odd number;

a second different mode delay configured to delay an output of the second output selector for a predetermined time and output said delayed output when the deviation signal has an odd number; and an output processor configured to pass an output of the first different mode delay or the second different mode delay.

10. The latency control circuit of claim 9, wherein each of the first and second flip-flop groups includes flip-flops as many as ensuring a minimum delay time generated by latency of a chip.

11. The latency control circuit of claim 3, wherein the command signal processing unit includes:
a second clock buffer configured to output a buffered command signal by buffering the input command signal;
a command decoder configured to decode the buffered command signal and output the read signal having a pulse type; and
a second variable delay duplicator configured to output the variable delay duplication signal by delaying the read signal as much as the variable delay time of the first variable delay duplicator.

12. The latency control circuit of claim 11, wherein the first clock buffer and the second clock buffer have the same delay time.

13. A latency control circuit comprising:
a clock buffer configured to buffer an input clock signal and output a buffered clock signal;
a first variable delay duplicator configured to generate a variable delay clock by delaying the buffered clock signal output as much as a variable delay time;
a clock delay configured to output a plurality of serial delay signals obtained by serially delaying the variable delay clock with the same intervals;
a deviation information generating unit configured to generate a deviation signal on the basis of a delay value with a command decoder delay time and latency information;
a clock selector configured to generate a plurality of clock selection signals based on the plurality of serial delay signals and the deviation signal;
a command decoder configured to generate a read signal having a pulse type based on an input command signal;
a second variable delay duplicator configured to generate a variable delay duplication signal by delaying the read signal as much as the variable delay time of the first variable delay duplicator; and
a latency shifter configured to output a latency signal by combining the plurality of clock selection signals output from the clock selector with the variable delay duplication signal output from the command signal processing unit.

14. The latency control circuit of claim 13, wherein the clock delay includes:
a divider configured to output a division signal by dividing the variable delay clock; and
a plurality of division delays connected in series and configured to serially delay the division signal and output the plurality of serial delay signals.

15. The latency control signal of claim 14, wherein the clock selector includes:
an even-numbered clock selection signal generator configured to generate a multiplicity of even-numbered clock selection signals based on the serial delay signals and the deviation signal; and
an odd-numbered clock selection signal generator configured to generate a multiplicity of odd-numbered clock selection signals by inverting the even-numbered clock selection signals, wherein the plurality of clock selection signals includes the even-numbered clock selection signals and the odd-numbered clock selection signals.

16. The latency control signal of claim 15, wherein the serial delay signals and the even-numbered clock selection signals are determined as follows:

$$e[k]=r[m],\ 0 \le k \le 7,\ \text{and}$$

$$m=<10/7*k>,$$

wherein r[m] represents a serial delay signal, and e[k] represents an even-numbered clock selection signal, and wherein, in <10/7*k>, 10 represents the number of the serial delay signals, 7 represents a value obtained by subtracting 1 from the number of the even-numbered clock selection signals, and < > means round-off.

17. The latency control circuit of claim 15, wherein the latency shifter includes:
a first flip-flop group including a plurality of flip-flops, which are connected in series and configured to delay the variable delay duplication signal in synchronization with the even-numbered clock selection signals;
a second flip-flop group including a plurality of flip-flops, which are connected in series and configured to delay the variable delay duplication signal in synchronization by the odd-numbered clock selection signal;
a first input selector configured to selectively input the variable delay duplication signal to one flip-flop in the first flip-flop group;
a second input selector configured to selectively input the variable delay duplication signal to one flip-flop in the second flip-flop group;
a first output selector configured to select and output one of outputs of the flip-flops in the first flip-flop group;
a second output selector configured to select and output one of outputs of the flip-flops in the second flip-flop group;
a first different mode delay configured to delay an output of the first output selector for a predetermined time and output said delayed output when the deviation signal has an odd number;
a second different mode delay configured to delay an output of the second output selector for a predetermined time and output said delayed output when the deviation signal has an odd number; and
an output processor configured to pass an output of the first different mode delay or the second different mode delay.

18. The latency control unit of claim 13, wherein the delay value excluding a command decoder delay time from a delay value that is undergone in a chip is the sum of the variable delay time, a clock buffer delay time, and a serializer delay time.

19. A semiconductor device comprising:
a latency control circuit comprising:
a clock delay configured to output a plurality of serial delay signals obtained by serially delaying an input clock signal with the same intervals;
a deviation information generating unit configured to generate a deviation signal on the basis of a delay value with a command decoder delay time and latency information;
a clock selector configured to generate a plurality of clock selection signals based on the plurality of serial delay signals and the deviation information;
a command signal processing unit configured to generate a read signal based on an input command signal, and output a variable delay duplication signal by variably delaying the read signal; and a latency shifter configured to output a latency signal by combining the plurality of clock selection signals output from the clock selector with the variable delay duplication signal output from the command signal processing unit.

20. The semiconductor device of claim 19, wherein the latency control circuit further comprises:

a first clock buffer disposed at the front end of the clock delay and configured to buffer a clock signal and output a buffered clock signal; and a first variable delay duplicator configured to output the input clock signal by delaying the buffered clock signal as much as a variable delay time.

21. A method for compensating a command decoder delay time, the method comprising:

outputting a plurality of serial delay signals obtained by serially delaying an input clock signal with the same intervals;

generating a deviation signal on the basis of a delay value with a command decoder delay time and latency information;

generating a plurality of clock selection signals based on the plurality of serial delay signals and the deviation information;

generating a read signal based on an input command signal, and outputting a variable delay duplication signal by variably delaying the read signal; and outputting a latency signal by combining the plurality of clock selection signals with the variable delay duplication signal.

22. The method of claim 21, further comprising:

buffering a clock signal and output a buffered clock signal; and outputting the input clock signal by delaying the buffered clock signal as much as a variable delay time.

23. The method of claim 21, further comprising:

outputting a division signal by dividing the input clock signal; and serially delaying the division signal and outputting the plurality of serial delay signals.

* * * * *